United States Patent
Huli et al.

(10) Patent No.: US 9,086,631 B2
(45) Date of Patent: Jul. 21, 2015

(54) EUV RESIST SENSITIVITY REDUCTION

(71) Applicant: TOKYO ELECTRON LIMITED, Tokyo (JP)

(72) Inventors: Lior Huli, Delmar, NY (US); David Hetzer, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 128 days.

(21) Appl. No.: 13/865,138

(22) Filed: Apr. 17, 2013

(65) Prior Publication Data
US 2014/0315135 A1    Oct. 23, 2014

Related U.S. Application Data

(60) Provisional application No. 61/693,663, filed on Aug. 27, 2012.

(51) Int. Cl.
G03F 7/20    (2006.01)
G03F 7/40    (2006.01)

(52) U.S. Cl.
CPC ............... *G03F 7/40* (2013.01); *G03F 7/2004* (2013.01)

(58) Field of Classification Search
CPC .................................. G03F 7/20; G03F 7/2004
USPC .................................................. 430/311, 322
See application file for complete search history.

(56) References Cited

U.S. PATENT DOCUMENTS

| | | | |
|---|---|---|---|
| 6,582,891 B1 | 6/2003 | Hallock | |
| 6,709,807 B2 | 3/2004 | Hallock | |
| 7,135,419 B2 | 11/2006 | Chandhok et al. | |
| 7,405,032 B1 | 7/2008 | Amblard et al. | |
| 7,733,502 B2 | 6/2010 | Moriya et al. | |
| 2003/0049571 A1 | 3/2003 | Hallock | |
| 2008/0295061 A1* | 11/2008 | Eisenmann et al. | ............ 716/21 |
| 2009/0108486 A1 | 4/2009 | Babin | |
| 2009/0152238 A1 | 6/2009 | Inatomi | |
| 2009/0214985 A1 | 8/2009 | Kulp | |
| 2010/0291490 A1 | 11/2010 | Tsuruda et al. | |
| 2011/0070545 A1 | 3/2011 | Dunn et al. | |
| 2011/0244402 A1 | 10/2011 | Carcasi et al. | |
| 2011/0244403 A1 | 10/2011 | Carcasi et al. | |

FOREIGN PATENT DOCUMENTS

| | | |
|---|---|---|
| EP | 2287668 A1 | 2/2011 |
| WO | 2009079284 A1 | 6/2009 |
| WO | 2011123433 A2 | 10/2011 |

OTHER PUBLICATIONS

European Patent Office, International Search Report and Written Opinion issued in corresponding Application No. PCT/US2013/056592 dated Dec. 18, 2013, 10 pp.
The International Bureau of WIPO, International Preliminary Report on Patentability issued in corresponding International Application No. PCT/US2013/056592, dated Mar. 12, 2015, 6 pp.

* cited by examiner

*Primary Examiner* — Kathleen Duda
(74) *Attorney, Agent, or Firm* — Wood, Herron & Evans, LLP

(57) ABSTRACT

A method for patterning a substrate is described. The method includes forming a layer of radiation-sensitive material on a substrate, and preparing a pattern in the layer of radiation-sensitive material using a lithographic process, wherein the pattern is characterized by a critical dimension (CD) and a roughness. Following the preparation of the pattern in the layer of radiation-sensitive material, the method further includes performing a CD slimming process to reduce the CD to a reduced CD, and performing a vapor smoothing process to reduce the roughness to a reduced roughness.

19 Claims, 14 Drawing Sheets

Post Develop POR

Post Develop 25% energy reduction   Post slimming 25% energy reduction   Post smoothing 25% energy reduction

EUV RESIST SENSITIVITY REDUCTION

CROSS-REFERENCE TO RELATED APPLICATIONS

This application claims the benefit of and priority to U.S. provisional application Ser. No. 61/693,663, entitled "EUV RESIST SENSITIVITY REDUCTION", filed on Aug. 27, 2012, the entire content of which is incorporated by reference in its entirety.

BACKGROUND OF THE INVENTION

1. Field of Invention

The invention relates to a method for patterning a thin film on a substrate, and more particularly to a method for reducing resist sensitivity.

2. Description of Related Art

In material processing methodologies, pattern etching comprises the application of a layer of radiation-sensitive material, such as photo-resist, to an upper surface of a substrate, the formation of a pattern in the layer of radiation-sensitive material using photo-lithography, and the transfer of the pattern formed in the layer of radiation-sensitive material to an underlying thin film on the substrate using an etching process. The patterning of the radiation-sensitive material generally involves exposure of the radiation-sensitive material to a pattern of electromagnetic (EM) radiation using, for example, a photo-lithography system, followed by the removal of the irradiated regions of the radiation-sensitive material (as in the case of positive tone resist), or non-irradiated regions (as in the case of negative tone resist) using a developing solution.

As the critical dimension (CD) decreases, there is a need to increase the resolution of the pattern of EM radiation (Resolution) and the sensitivity of the resist (Sensitivity) while keeping the line width roughness (LWR) of the resulting pattern within acceptable limits. It is known in the art that there is a tradeoff relationship between Resolution, LWR, and Sensitivity, often called the LRS tradeoff triangle. Conventional techniques which seek to improve one of the three parameters often improve at the unacceptable expense of one or both of the other parameters. Extreme ultra violet (EUV) lithography shows promising results for feature sizes below 40 nm. However, EUV resist sensitivity is one of the challenges for EUV lithography. As noted in the LRS tradeoff above, it is very difficult to obtain simultaneous improvements in resolution, LWR, and sensitivity. There is need for a method and system that allows the reduction of resist sensitivity significantly without impact to the LWR and resolution in order to achieve an enabling throughput for EUV lithography.

SUMMARY OF THE INVENTION

A method for patterning a substrate is described. The method includes forming a layer of radiation-sensitive material on a substrate, and preparing a pattern in the layer of radiation-sensitive material using a EUV lithographic process, wherein the pattern is characterized by a critical dimension (CD) and a roughness. Following the preparation of the pattern in the layer of radiation-sensitive material, the method further includes performing a CD slimming process to reduce the CD to a reduced CD, and performing an optional vapor smoothing process to reduce the roughness to a reduced roughness.

DETAILED DESCRIPTION OF SEVERAL EMBODIMENTS

Figure 1A:
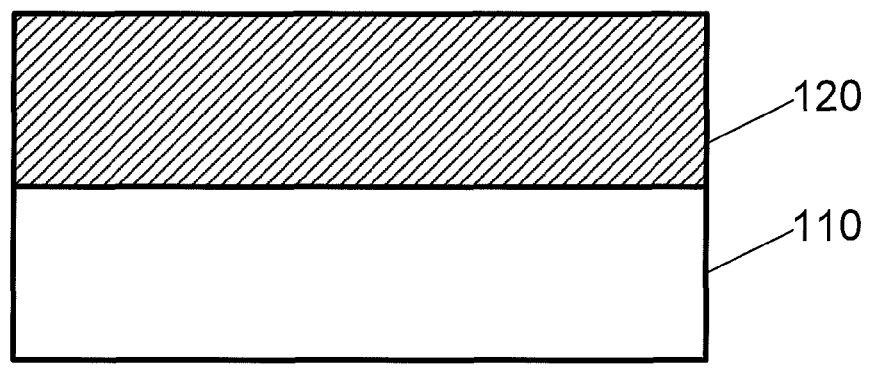
FIGS. 1A through 1C present a simplified schematic representation of a method of patterning a substrate according to an embodiment.

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In this application, the terms dose and energy are used interchangeably to mean the EUV radiation used to irradiate the EUV photo-resist. Furthermore, resist and photo-resist are used interchangeably to mean photo-resist.

Referring now to the drawings, wherein like reference numerals designate identical or corresponding parts throughout the several views, FIGS. 1A through 1C, and FIG. 2 illustrate a method for patterning a substrate according to an embodiment. The method is illustrated in a flow chart 200, and begins in 210 with forming a layer of radiation-sensitive material 120 on a substrate 110. The layer of radiation-sensitive material 120 may include a photo-resist. For example, the layer of radiation-sensitive material 120 may comprise a 248 nm (nanometer) resist, a 193 nm resist, a 157 nm resist, an EUV (extreme ultraviolet) resist, or an electron beam sensitive resist. Furthermore, for example, the first layer of radiation-sensitive material 120 may comprise a thermal freeze photo-resist, an electromagnetic (EM) radiation freeze photo-resist, or a chemical freeze photo-resist. In one embodiment, an EUV resist may be characterized as a photo-sensitive material whose solubility in basic solutions changes when exposed to EM radiation at EUV wavelengths, e.g., EM wavelengths ranging from about 11 nm to about 14 nm.

The layer of radiation-sensitive material 120 may be formed by spin-coating the material onto substrate 110. The first layer of radiation-sensitive material 120 may be formed using a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate 110 and one or more cooling cycles, following the one or more first PABs, to cool the substrate 110.

Figure 1B:
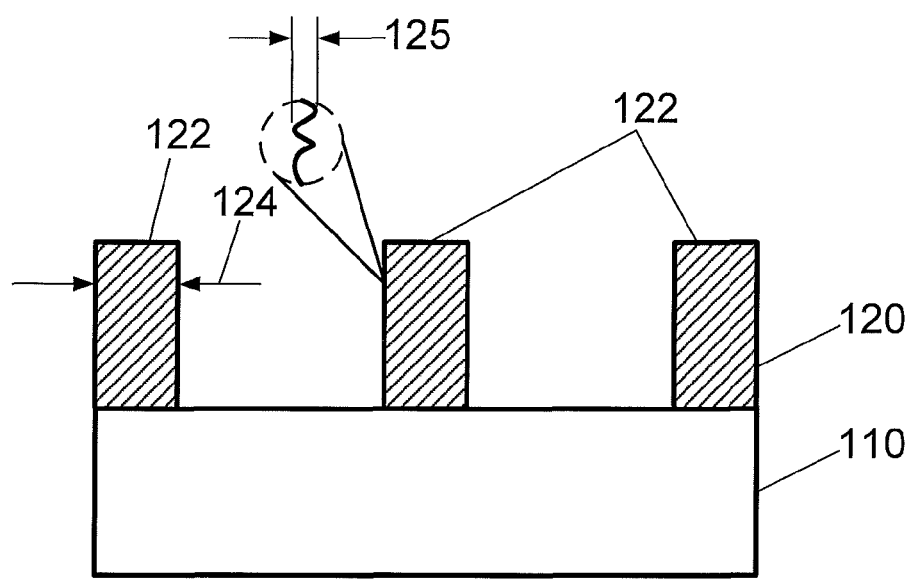

In 220 and as shown in FIG. 1B, a pattern 122 is prepared in the layer of radiation-sensitive material 120. The substrate 110 having the layer of radiation-sensitive material 120 is aligned at an alignment position in a radiation exposure system and imaged with radiation having an image pattern. The radiation exposure system may include a dry or wet photo-lithography system. The image pattern may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the image pattern may be formed using an electron beam lithography system.

The layer of radiation-sensitive material 120, having been exposed to the image pattern, is subjected to a developing process in order to remove the image pattern region, and form pattern 122 in the layer of radiation-sensitive material 120. The pattern 122 may be characterized by a critical dimension (CD) 124 and a roughness 125. The roughness 125 may include a line edge roughness (LER), or a line width roughness (LWR), or both LER and LWR. The pattern 122 may include a line pattern. The developing process can include exposing the substrate to a developing solution in a developing system, such as a track system. For example, the track system can comprise a Clean Track ACT® 8, ACT® 12, LITHIUS®, LITHIUS™ Pro™, or LITHIUS™ Pro V™ resist coating and developing system commercially available from Tokyo Electron Limited (TEL). The developing process may be preceded by one or more first post-exposure bakes (PEB) to heat the substrate 110 and one or more cooling cycles, following the one or more first PEBs, to cool the substrate 110.

Figure 1C:
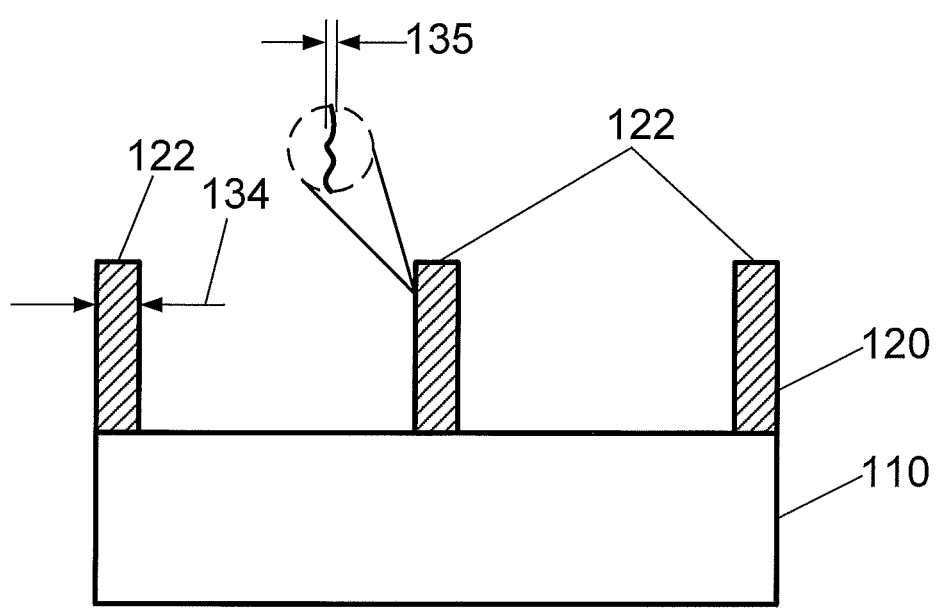
Figure 2:
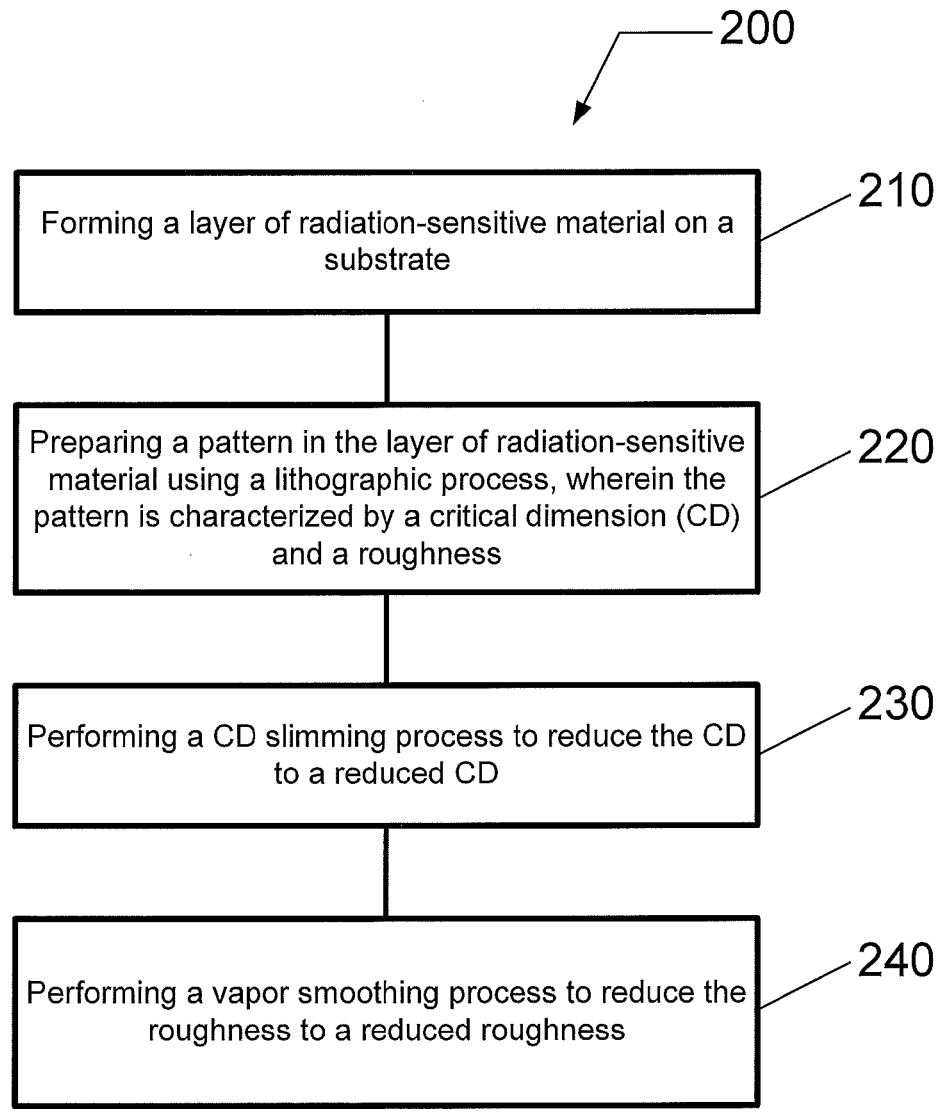
FIG. 2 provides a flow chart illustrating a method of patterning a substrate according to another embodiment.
Figure 3:
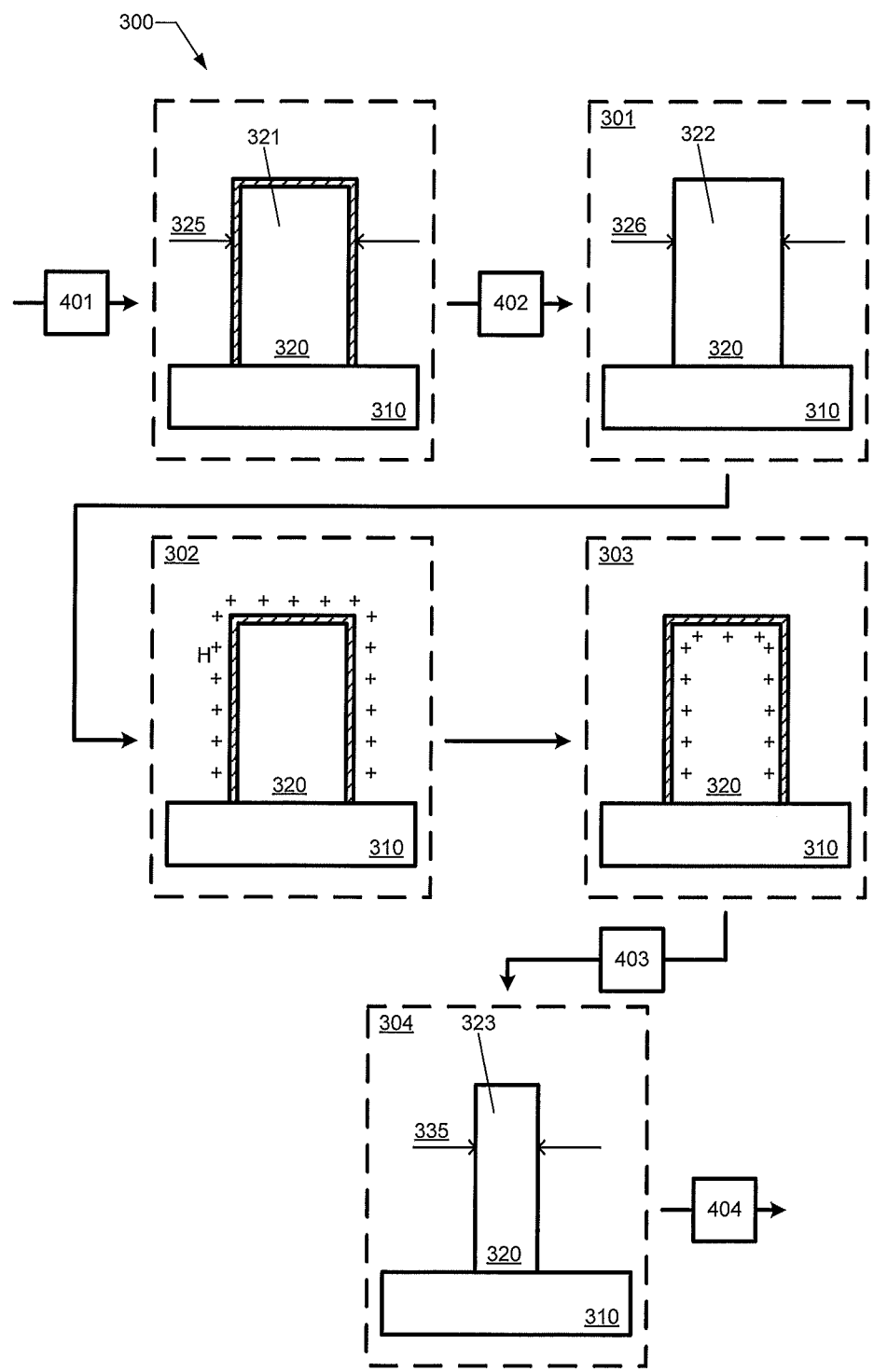
FIG. 3 presents a simplified schematic representation of a method for performing a CD slimming process according to another embodiment.

In 230 and as shown in FIG. 1C, following the preparation of pattern 122 in the layer of radiation-sensitive material 120, a critical dimension (CD) slimming process is performed to reduce the CD 124 to a reduced CD 134. FIG. 3 illustrates a CD slimming process, and FIGS. 9A and 9B provide exemplary data for the CD slimming process.

In 240 and as also shown in FIG. 1C, following the preparation of pattern 122 in the layer of radiation-sensitive material 120, a smoothing process is performed to reduce the roughness 125 to a reduced roughness 135. FIGS. 4A through 4E illustrate a smoothing process, such as a vapor smoothing process, and FIGS. 10A and 10B provide exemplary data for the vapor smoothing process.

As noted above, the smoothing process may include a vapor (vapor-phase) smoothing process. However, it may also include a liquid (liquid-phase) smoothing process, or a combination of vapor and liquid smoothing processes. The liquid smoothing process may include performing one or more surfactant-containing rinse processes, for example. Additional details for a surfactant-containing rinse process for reducing roughness may be found in U.S. patent application Ser. No. 13/206,441, entitled "Multiple Chemical Treatment Process for Reducing Pattern Defect" and filed on Aug. 9, 2011.

The smoothing process may additionally include thermal treatment, e.g., elevation of the substrate temperature. The smoothing process may further include exposure to electromagnetic (EM) radiation, such as ultraviolet (UV) radiation, microwave radiation, or electron beam radiation.

As illustrated pictorially in FIG. 3, the CD slimming process comprises a process sequence 300 beginning with receiving a substrate 310 having a layer of radiation-sensitive material 320 formed thereon within which pattern 321 is prepared. As described above, following the exposure of the layer of radiation-sensitive material 320 to electromagnetic (EM) radiation in the photo-lithography system, the layer of radiation-sensitive material 320 is developed by exposing the layer of radiation-sensitive material 320 to a first developing solution, thus, leaving behind pattern 321 having CD 325. During the exposure of the layer of radiation-sensitive material 320 to EM radiation, a (cross-hatched) portion of the pattern 321 is exposed to EM radiation of intermediate intensity, yet remains following exposure to the first developing solution.

In 301, the layer of radiation-sensitive material 320 is developed further by exposing the layer of radiation-sensitive material 320 to a second developing solution at an elevated temperature. In doing so, the second developing solution at the elevated temperature removes the (cross-hatched) portion of the pattern 321 that is exposed to EM radiation of intermediate intensity leaving behind an intermediate pattern 322 with an intermediate reduced CD 326. As an example, the second developing solution may include a TMAH-containing solution elevated to a hot develop temperature greater than or equal to about 23 degrees C. Alternatively, as an example, the second developing solution may include a TMAH-containing solution elevated to a hot develop temperature greater than or equal to about 25 degrees C. Alternatively, as an example, the second developing solution may include a TMAH-containing solution elevated to a hot develop temperature greater than or equal to about 30 degrees C. Alternatively, as an example, the second developing solution may include a TMAH-containing solution elevated to a hot develop temperature greater than or equal to about 23 degrees C. and less than or equal to about 50 degrees C. Alternatively yet, as an example, the second developing solution may include a TMAH-containing solution elevated to a hot develop temperature greater than or equal to about 30 degrees C. and less than or equal to about 50 degrees C. In this process step, the concentration of the developing solution, the temperature, and the time for exposure are process parameters that may be adjusted to achieve pattern CD control.

In 302, the intermediate pattern 322 with intermediate reduced CD 326 is treated with an acid (represented with "+" signs, and/or H$^+$) solution. As an example, an acid-containing solution may be applied to the layer of radiation-sensitive material 320 with intermediate reduced CD 326 via spin-coating, as described above. In this process step, the concentration of the acid-containing solution, the temperature, and the time for exposure are process parameters that may be adjusted to achieve pattern CD control.

In 303, the layer of radiation-sensitive material 320 is elevated in temperature to diffuse the acid into the pattern in the layer of radiation-sensitive material 320. As an example, the layer of radiation-sensitive material 320 is elevated to a bake temperature greater than or equal to about 50 degrees C. Alternatively, as an example, the layer of radiation-sensitive material 320 is elevated to a bake temperature ranging from about 50 degrees C. to about 180 degrees C. In this process step, the temperature and the time for exposure are process parameters that may be adjusted to achieve pattern CD control.

In 304, the layer of radiation-sensitive material 320 is developed further yet by exposing the layer of radiation-sensitive material 320 to a third developing solution. In doing so, the third developing solution produces a final pattern 323 in the layer of radiation-sensitive material 320 with a reduced CD 335. As an example, the third developing solution may include a TMAH-containing solution at room temperature. In this process step, the concentration of the developing solution, the temperature, and the time for exposure are process parameters that may be adjusted to achieve pattern CD control.

Additional details for a CD slimming process may be found in U.S. Patent Application Publication Serial No. 2010/0291490A1, entitled "Resist Pattern Slimming Treatment Method". Other details for a CD slimming process may be found in U.S. patent application Ser. No. 12/751,362, entitled "Method of Slimming Radiation-Sensitive Material Lines in Lithographic Applications", filed on Mar. 31, 2010, and published as U.S. Patent Application Publication No. 2011/0244402, or U.S. patent application Ser. No. 13/077,833, entitled "Method of Slimming Radiation-Sensitive Material Lines in Lithographic Applications", filed on Mar. 31, 2011, and published as U.S. Patent Application Publication No. 2011/0244403.

Figure 5A:
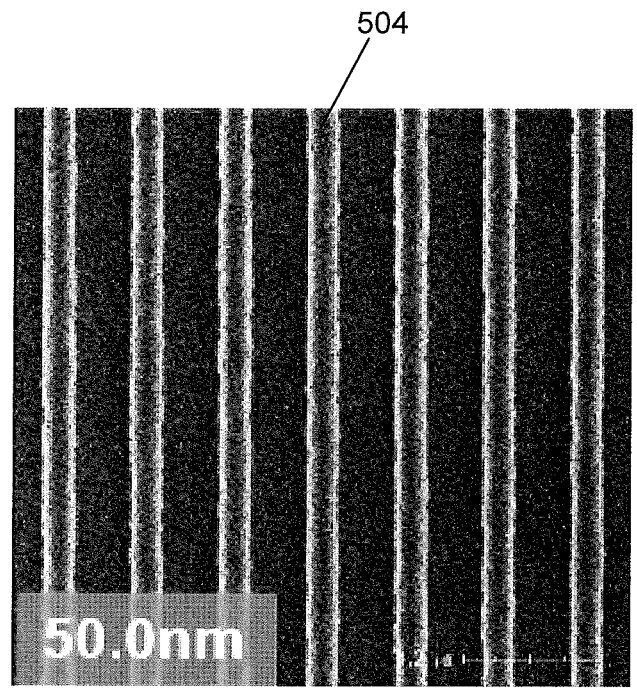
FIGS. 5A and 5B provides exemplary data for performing a CD slimming process.
Figure 5B:
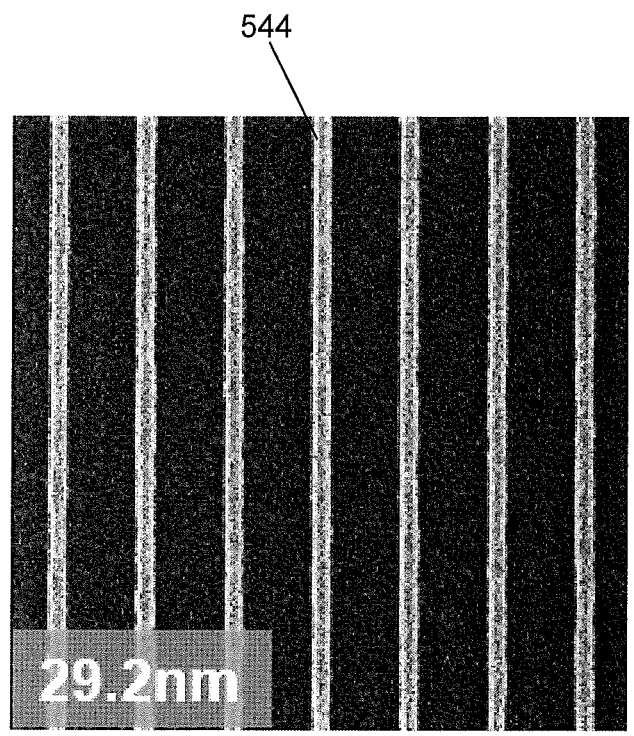

As shown in FIGS. 5A and 5B, a CD slimming process is performed to reduce a first line CD 504 of about 50 nm (nanometers) to a second line CD 544 of about 29.2 nm.

Figure 4A:
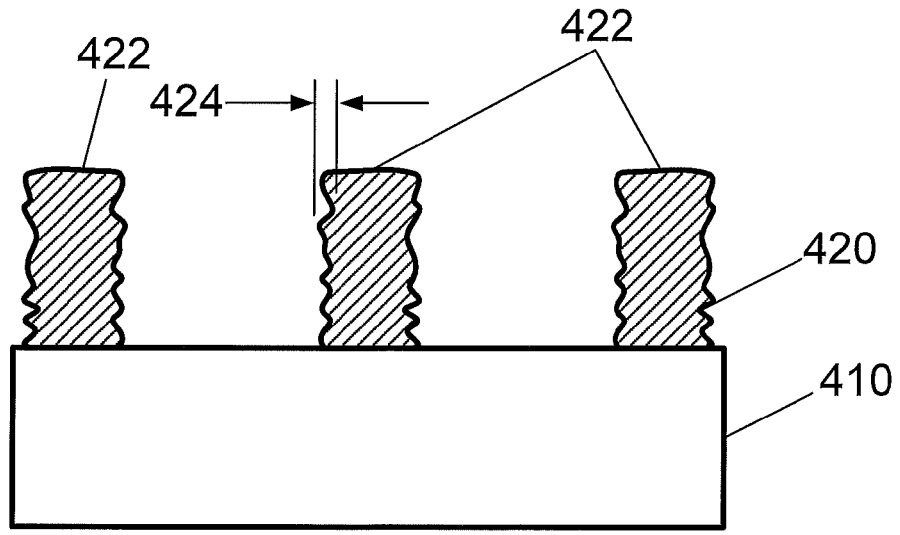
FIGS. 4A through 4E present a simplified schematic representation of a method for performing a vapor smoothing process according to another embodiment.

As illustrated pictorially in FIGS. 4A through 4E, the smoothing process comprises a process sequence beginning with receiving a substrate 410 having a layer of radiation-sensitive material 420 formed thereon within which pattern 422 is prepared (see FIG. 4A). As described above, following the exposure of the layer of radiation-sensitive material 420 to electromagnetic (EM) radiation in the photo-lithography system, the layer of radiation-sensitive material 420 is developed by exposing the layer of radiation-sensitive material 420 to a developing solution, thus, leaving behind a pattern 422 having roughness 424.

Figure 4B:
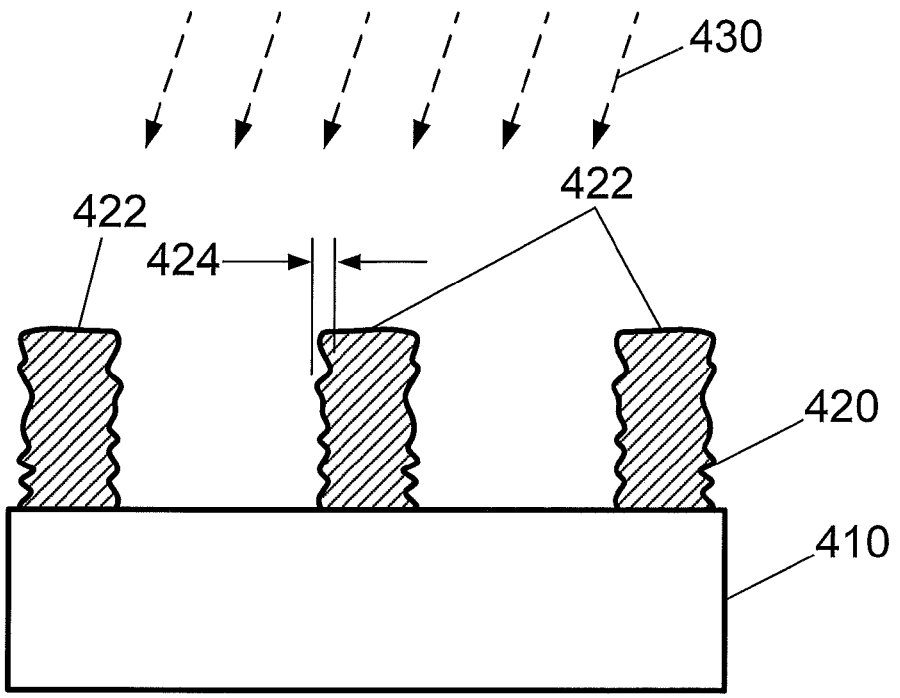

As described above, the smoothing process may include a vapor-phase smoothing process. Therein, as shown in FIG. 4B, the pattern 422 in the layer of radiation-sensitive material 420 is exposed to a vapor-phase environment 430. In one embodiment, the vapor-phase environment 430 may include a treatment vapor containing N-Methylpyrrolidone or N-Methyl-2-pyrrolidone. For example, substrate 410 may be exposed to an atomized spray of a treatment solution. Additionally, the substrate may be heated to elevate the temperature of the substrate during the exposing of pattern 422 on substrate 410 to the treatment vapor. The temperature of the substrate may range from about 20 degrees C. to about 100 degrees C., and may preferably range from about 30 degrees C. to about 50 degrees C. Furthermore, the substrate may be irradiated with electromagnetic (EM) radiation during the exposing of pattern 422 on substrate 410 to the treatment vapor. In this process step, the concentration of the treatment solution, the temperature of the substrate, the pressure for the vapor-phase environment 430, and the time for exposure are process parameters that may be adjusted to achieve roughness reduction or control.

Figure 4C:
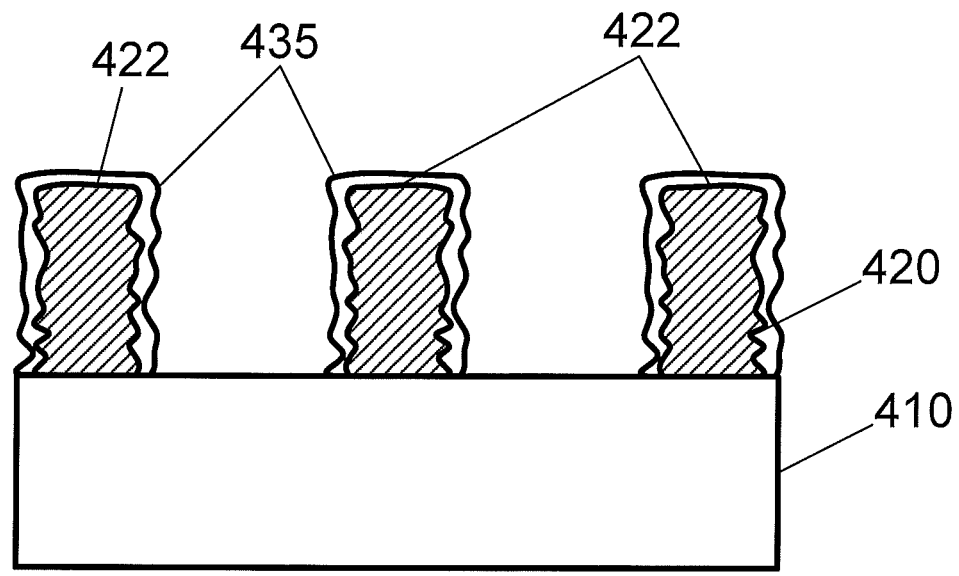
Figure 4D:
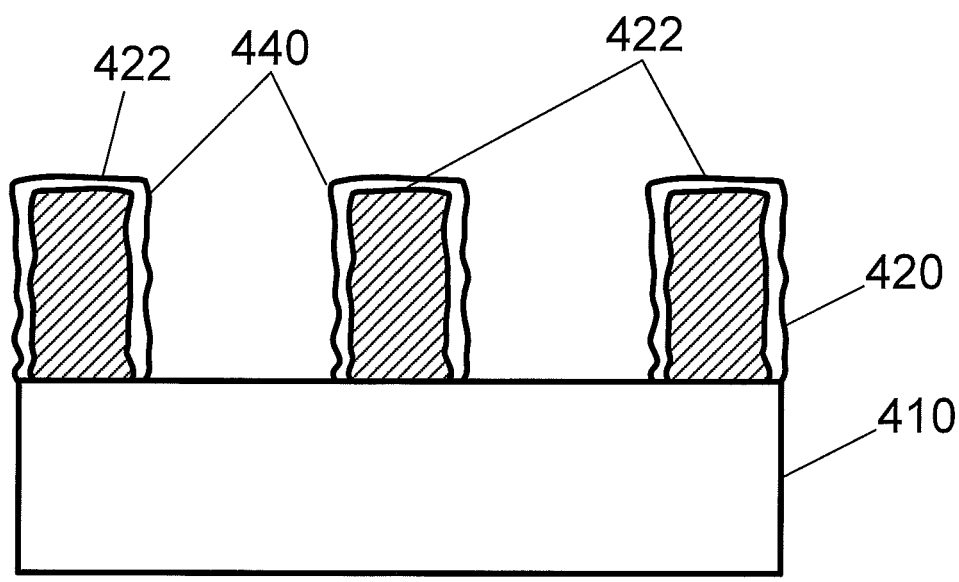

As shown in FIG. 4C, a chemically treated surface layer 435 is created as a result of the exposure of the layer of radiation-sensitive material 420 having pattern 422 prepared therein to the vapor-phase environment 430. The vapor-phase environment 430 reacts with the exposed portions of the layer of radiation-sensitive material 420 to cause "melting" or reflowing of the radiation-sensitive material within the chemically treated surface layer 435 to form a reflowed layer 440 and, thus, smooth the exposed surface of the layer of radiation-sensitive material 420 (see FIG. 4D).

Figure 4E:
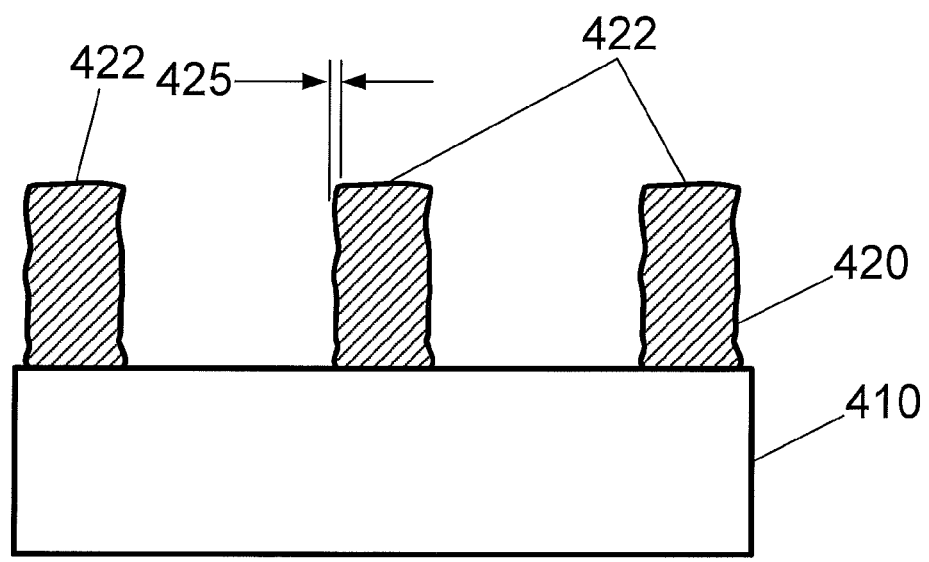

Thereafter, as shown in FIG. 4E, the pattern 422 is subjected to a drying process to remove any residue from the exposure to the vapor-phase environment 430. The drying process may include a spin drying process at atmospheric or vacuum pressure. The drying process may further include dispensing a drying fluid on the pattern 422. The drying fluid may be in a gaseous or liquid phase. For example, the drying fluid may include isopropyl alcohol (IPA). As shown in FIG. 4E, the smoothing process results in a reduction of roughness 414 to a reduced roughness 425.

Figure 5C:
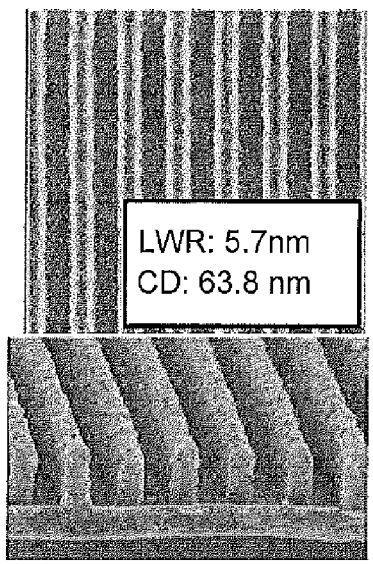
FIGS. 5C and 5D provides exemplary data for performing a CD vapor smoothing process.
Figure 5D:
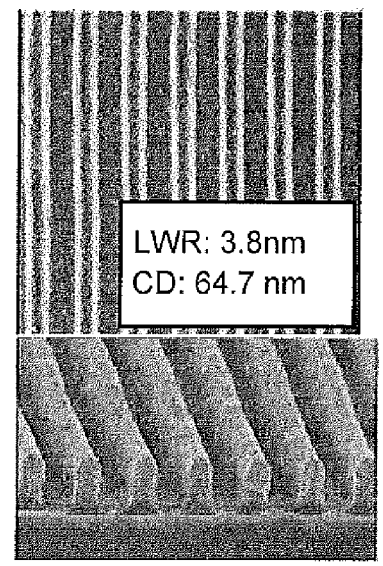

As shown in FIGS. 5C and 5D, a vapor smoothing process is performed to reduce a first line width roughness (LWR) 564 of about 5.7 nm (nanometers) with a line CD of 63.8 nm to a second LWR of about 3.8 nm with a line CD 584 of about 64.7 nm.

The smoothing process may be performed preceding (see sequence position 401 in FIG. 3), following (see sequence position 404 in FIG. 3), or during (see sequence positions 402, 403 in FIG. 3) the CD slimming process. During the CD slimming process, the smoothing process may be performed following the dispensing of the second developing solution elevated to a hot develop temperature, and preceding the treating of the substrate with the treating compound containing acid (see sequence position 402 in FIG. 3). Alternatively, during the CD slimming process, the smoothing process may be performed following the baking of the substrate to diffuse acid, and preceding the dispensing of the third developing solution (see sequence position 403 in FIG. 3). Alternatively yet, one or more additional smoothing processes may be performed to further reduce the reduced roughness to another reduced roughness.

The method of patterning a substrate may further comprise characterizing the roughness by determining a pre-smoothing roughness (i.e., roughness 125 in FIG. 1A) assessed immediately prior to the smoothing process and determining a post-smoothing roughness (i.e., reduced roughness 135 in FIG. 10) assessed immediately following the smoothing process, and achieving a reduction in the roughness exceeding 10%, wherein the reduction in the roughness is measured as a percentile ratio of a difference between the pre-smoothing roughness and the post-smoothing roughness to the pre-smoothing treatment roughness. Further yet, the smoothing process may achieve a reduction in the roughness exceeding 30%. Even further yet, the smoothing process may achieve a reduction in the roughness exceeding 50%.

Figure 6:
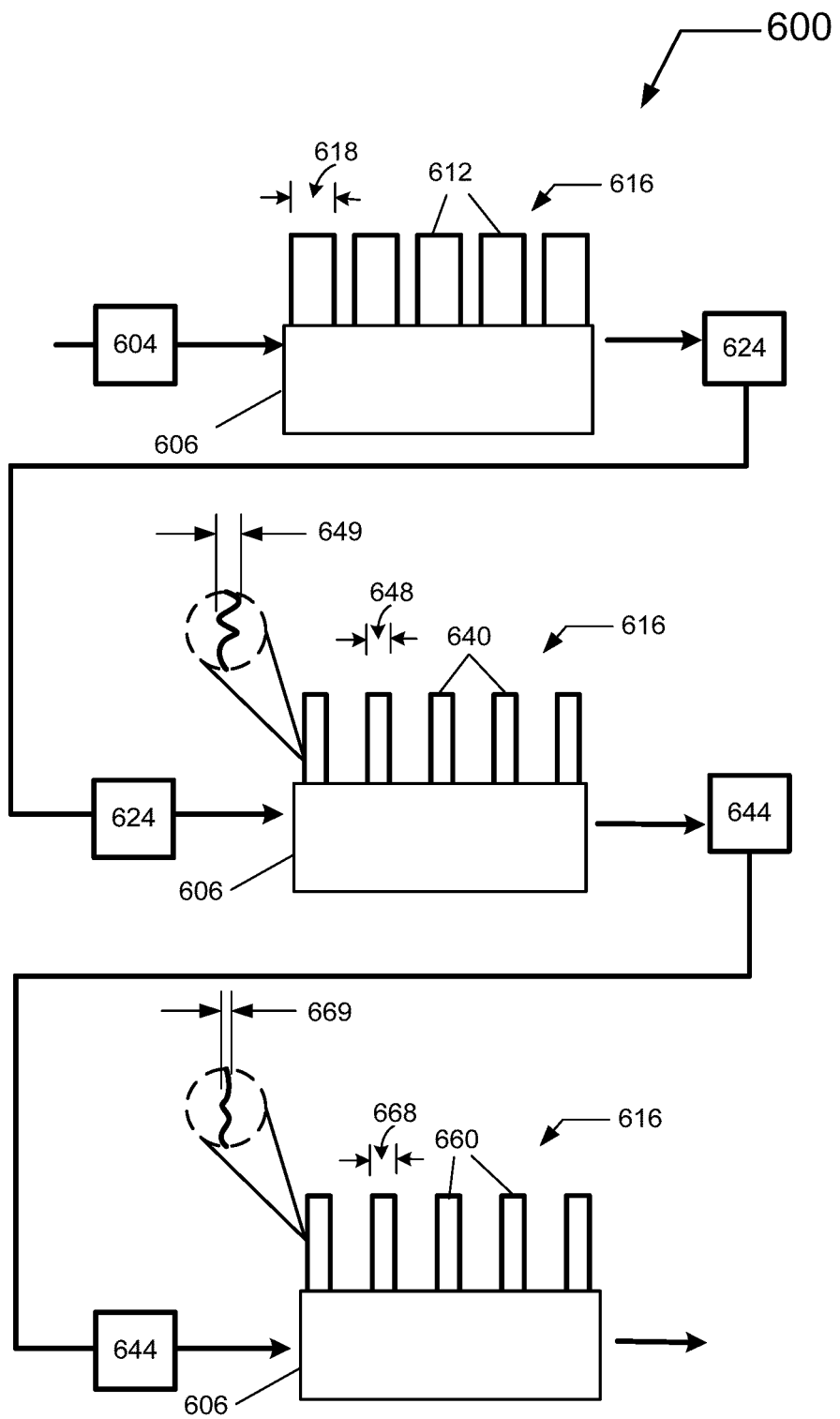
FIG. 6 presents a simplified schematic representation of a method of reducing EUV resist sensitivity in EUV lithography according to an embodiment.

FIG. 6 presents a simplified schematic 600 representation of a method of reducing EUV resist sensitivity in EUV lithography on a substrate 606 according to an embodiment. Starting with sequence position 604, a substrate 606 with a layer of radiation-sensitive material 616 where the resist is characterized by a target pattern is provided. In an embodiment, the substrate 606 can comprise a silicon layer; alternatively, the substrate 606 can comprise a silicon layer, an oxide layer, a metal layer, and/or a nitride layer. In another embodiment, the substrate can comprise the layers in the first embodiment above, one or more metallized layers, and/or one or more silicon and/or germanium-containing layers. As described above, the layer of radiation-sensitive material 616 is exposed to EUV radiation in a photo-lithography system, the layer of radiation-sensitive material 616 is developed by exposing the layer of radiation-sensitive material 616 to a developing solution, thus, leaving behind pattern 612 having CD 618. In an embodiment, the EUV wavelength is substantially 13.5 nm. The EUV light dose used in the first exposure dose is lower than what would be needed to achieve the target CD of the pattern 612, resulting in a first CD 618 that is larger than the target CD, i.e., in effect, operating at an exposure dose inadequate for a complete exposure given the reduced sensitivity of the layer of radiation-sensitive material 616 to the EUV radiation. The pattern 612 has a first roughness 649 as depicted in sequence position 624.

Still referring to FIG. 6 in sequence position 624, the layer of radiation-sensitive material 616 can be developed further by exposing the layer of radiation-sensitive material 616 to a subsequent developing solution at the same or at an elevated temperature. In doing so, the subsequent developing solution at the same or at the elevated temperature removes an additional layer of material in the pattern 612 that is exposed to EUV radiation of intermediate dose leaving behind a subsequent pattern 640 with an intermediate reduced CD smaller than the initial CD shown in sequence position 604. In sequence position 624, a CD slimming process is performed to reduce the initial CD or subsequent CD in pattern 640 to a second CD 648, substantially equivalent to the target CD, using one or more of the techniques discussed above.

In sequence position 644, an optional smoothing process is performed on the substrate 606. As described above, the smoothing process may include a vapor-phase smoothing process. The pattern 660 in the layer of radiation-sensitive material 616 is exposed to a vapor-phase environment. Additionally, the substrate 606 may be heated to elevate the temperature of the substrate 606 during the exposing of pattern 660 on substrate 606 to the treatment vapor. The temperature of the substrate 606 may range from about 20 degrees C. to about 100 degrees C., and may preferably range from about 30 degrees C. to about 50 degrees C. Furthermore, the substrate 606 may be irradiated with electromagnetic (EM) radiation during the exposing of pattern 660 on substrate 606 to the treatment vapor. In this process step, the concentration of the treatment solution, the temperature of the substrate 606, the pressure for the vapor-phase environment, and the time for exposure are process parameters that may be adjusted to achieve roughness reduction or control to a second roughness 669.

Other processes involved in vapor smoothing, includes, as shown in FIG. 4C above, a chemically treated surface layer 435 created as a result of the exposure of the layer of radiation-sensitive material 420 having pattern 422 prepared therein to the vapor-phase environment 430. The vapor-phase environment 430 reacts with the exposed portions of the layer of radiation-sensitive material 420 to cause "melting" or reflowing of the radiation-sensitive material within the chemically treated surface layer 435 and, thus, smooth the exposed surface of the layer of radiation-sensitive material 420 (see FIG. 4D). Thereafter, as shown in FIG. 4E, the pattern 422 is subjected to a drying process to remove any residue from the exposure to the vapor-phase environment 430. The drying process may include a spin drying process at atmospheric or vacuum pressure. The drying process may further include dispensing a drying fluid on the pattern 422. The drying fluid may be in a gaseous or liquid phase. For example, the drying fluid may include isopropyl alcohol (IPA).

Figure 7:
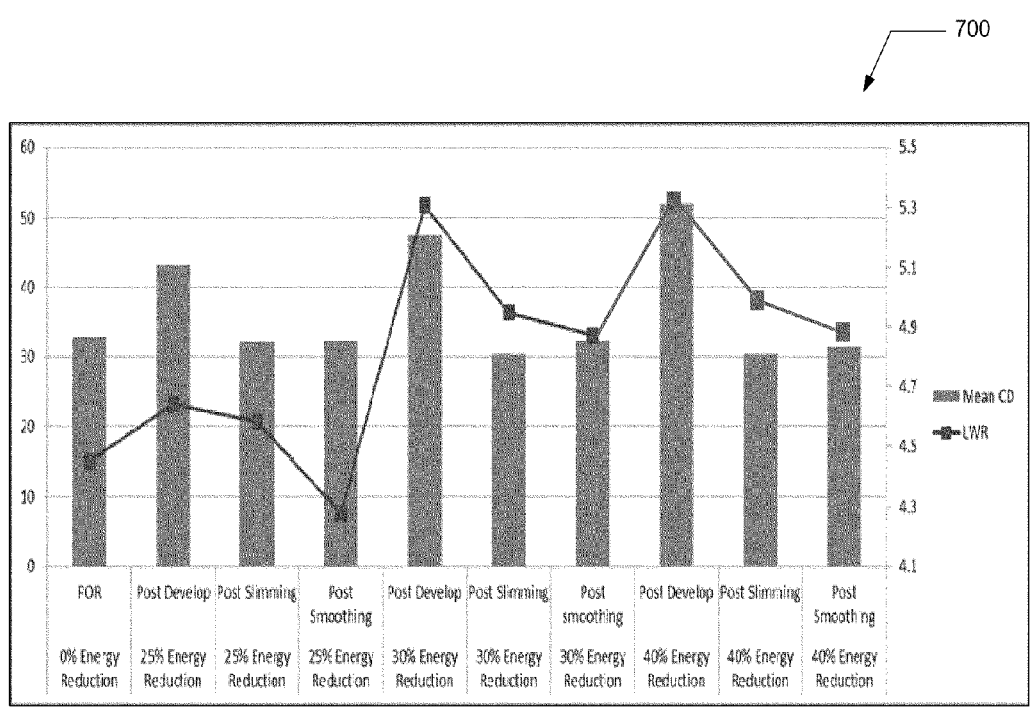
FIG. 7 is an exemplary graph of target CD and LWR of a pattern in a substrate using different energy reductions in the EUV electromagnetic radiation in several embodiments.

FIG. 7 is an exemplary graph 700 of target CD and LWR of a pattern in a substrate using different EUV energy reductions in the EUV electromagnetic radiation in several embodiments. In order to achieve the goal of high-volume manufacturing, also referred to above as enabling throughput, the photo-lithography tool must achieve about 50 wafers per hour or higher. The throughput of the photo-lithography tool is a function of the EUV energy, thus, for a higher EUV dose, the lesser the number of substrates per hour processed. Instead of operating at an increased EUV dose, exposure is performed at a reduced EUV dose to achieve adequate throughput and this invention reduces the EUV energy in order to get around the RLS tradeoff as mentioned above is circumvented by corrective steps, such as CD slimming and optional roughness reduction via pattern CD smoothing.

After the development of the substrate using reduced EUV dose/energy, a CD slimming process and an optional CD smoothing process are used to achieve the target CD and LWR of the pattern on the substrate. The inventors tested a substrate application for several EUV resist sensitivity reductions using a 32 nm target CD. In an embodiment, the EUV resist sensitivity reduction was done by reducing the exposure time of the EUV source and tests included the process of record (POR) used as a base line for comparison, a 25% energy reduction, a 30% energy reduction, and a 40% energy reduction. The reduction of sensitivity through EUV energy reduction in the irradiation of the pattern, (through reduction of exposure time of the resist), produced a significant increase in the EUV overall throughput that is substantially in the range of 50 or more wafers per hour needed for high volume manufacturing. In an embodiment, the sensitivity was reduced by reducing the EUV energy. Other embodiments may reduce the sensitivity by adjusting the intensity of the EUV source and/or the exposure time. As mentioned above, one way of reducing energy is by reducing the exposure time to the EUV energy. The EUV dose and intensity of EUV light are correlated to the exposure time, which can be determined using the following equation:

Calculated exposure time (s)=Dose(mJ/cm$^2$)/Intensity (mW/cm$^2$)            Eq. 1.0

Given a constant intensity of the EUV source, the calculated exposure time would go down as the EUV dose went down, increasing the number of substrates processed per hour.

In FIG. 7, the Y-axis on the left is the mean CD obtained using a fabrication process, the Y-axis on the right is the line width roughness, LWR, and the X-axis indicates POR or post develop, post slimming, or post smoothing for the different percentages of EUV energy reductions. From the graph 700, the data shows that the POR provides a mean CD of about 32 nm. With 25% energy reduction, the mean CD is about 43 nm post develop, 33 nm post slimming and 33 nm post smoothing whereas the LWR is about 4.6 nm post develop, 4.5 nm post slimming, and 4.2 nm post smoothing. With 30% energy reduction, the mean CD is about 47 nm post develop, 30 nm post slimming, and 30 nm post smoothing whereas the LWR is about 5.3 nm post develop, 4.9 nm post slimming, and 4.8 nm post smoothing. With 40% energy reduction, the mean CD is about 52 nm post develop, 30 nm post slimming, and 32 nm post smoothing. From the data, the mean CD after slimming of the 25% energy reduction delivers the same mean CD as the POR. Furthermore, the slimming process needs to be adjusted for different energy reduction levels. The data shows useful results in post development, post slimming, and post smoothing up to 40% reduction of energy. Furthermore, the LWR smoothing process needs to be more aggressive in the 30% and 40% energy reduction levels. The method and system of the present invention produced similar results between the 25% energy reduction and the POR. As mentioned above, the reduction of sensitivity through energy reduction in the irradiation of the pattern, which in turn was achieved through reduction of exposure time of the resist, resulted in a significant increase in the EUV overall throughput substantially in the range of 50 or more wafers per hour needed for high volume manufacturing.

Figure 8A:
FIGS. 8A to 8B provide exemplary images of a pattern in a substrate after performing a CD development process, a slimming process, and a smoothing process at different energy reduction percentages in an embodiment.
Figure 8B:
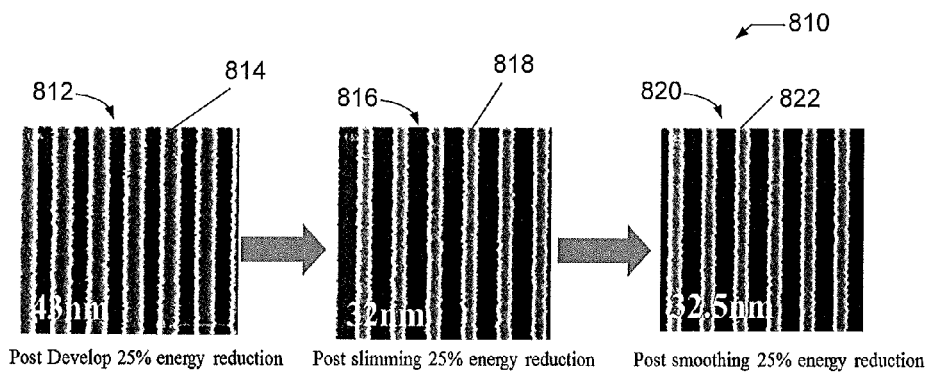

FIGS. 8A and 8B provide exemplary images 800 and 810, respectively, of a pattern in a substrate after performing a POR, or a CD development process, a slimming process, and a smoothing process at different energy reduction percentages in an embodiment. In FIG. 8A, the image of a post develop POR 802 is shown with pattern CD 804 averaging about 32.0 nm. In FIG. 8B, the reduction of energy is 25% compared to the energy used for the POR. The post develop image 812 shows a pattern CD 814 of about 43.0 nm, the post slimming image 816 shows a pattern CD 818 of about 32.0 nm, and the post smoothing image 820 shows a pattern CD 822 of about 32.5 nm.

Figure 8C:
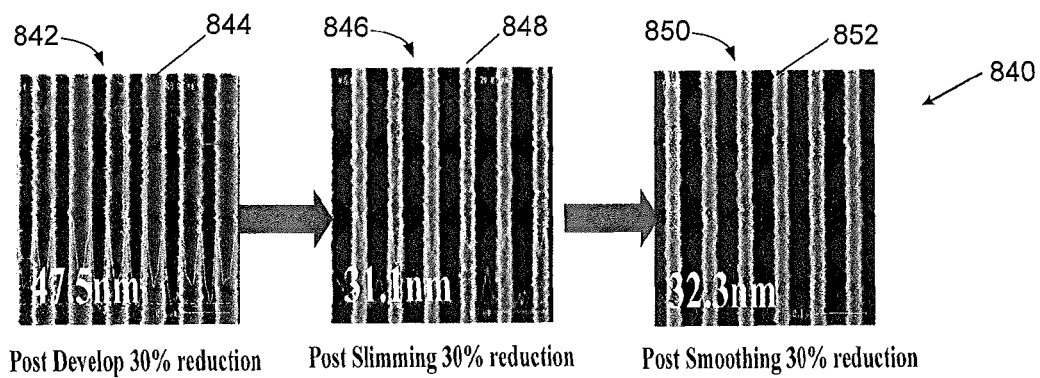
FIGS. 8C and 8D provide additional exemplary images of a pattern in a substrate after performing a CD development process, a slimming process, and a smoothing process at different energy reduction percentages in another embodiment.
Figure 8D:
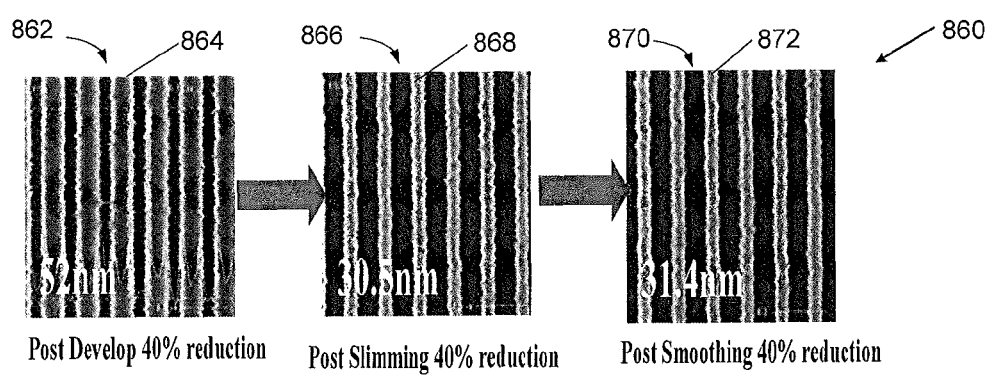

FIGS. 8C and 8D provide additional exemplary images 840 and 860, respectively, of a pattern in a substrate after performing a CD development process, a slimming process, and a smoothing process at different energy reduction percentages in an embodiment. In FIG. 8C, the reduction of energy is 30% compared to the energy used for the POR. The post develop image 842 shows a pattern CD 844 of about 47.5 nm, the post slimming image 846 shows a pattern CD 848 of about 31.1 nm, and the post smoothing image 850 shows a pattern CD 852 of about 32.3 nm. In FIG. 8D, the reduction of energy is 40% compared to the energy used for the POR. The post develop image 862 shows a pattern CD 864 of about 52.0 nm, the post slimming image 866 shows a pattern CD 868 of about 30.5 nm, and the post smoothing image 870 shows a pattern CD 872 of about 31.4 nm.

Figure 9:
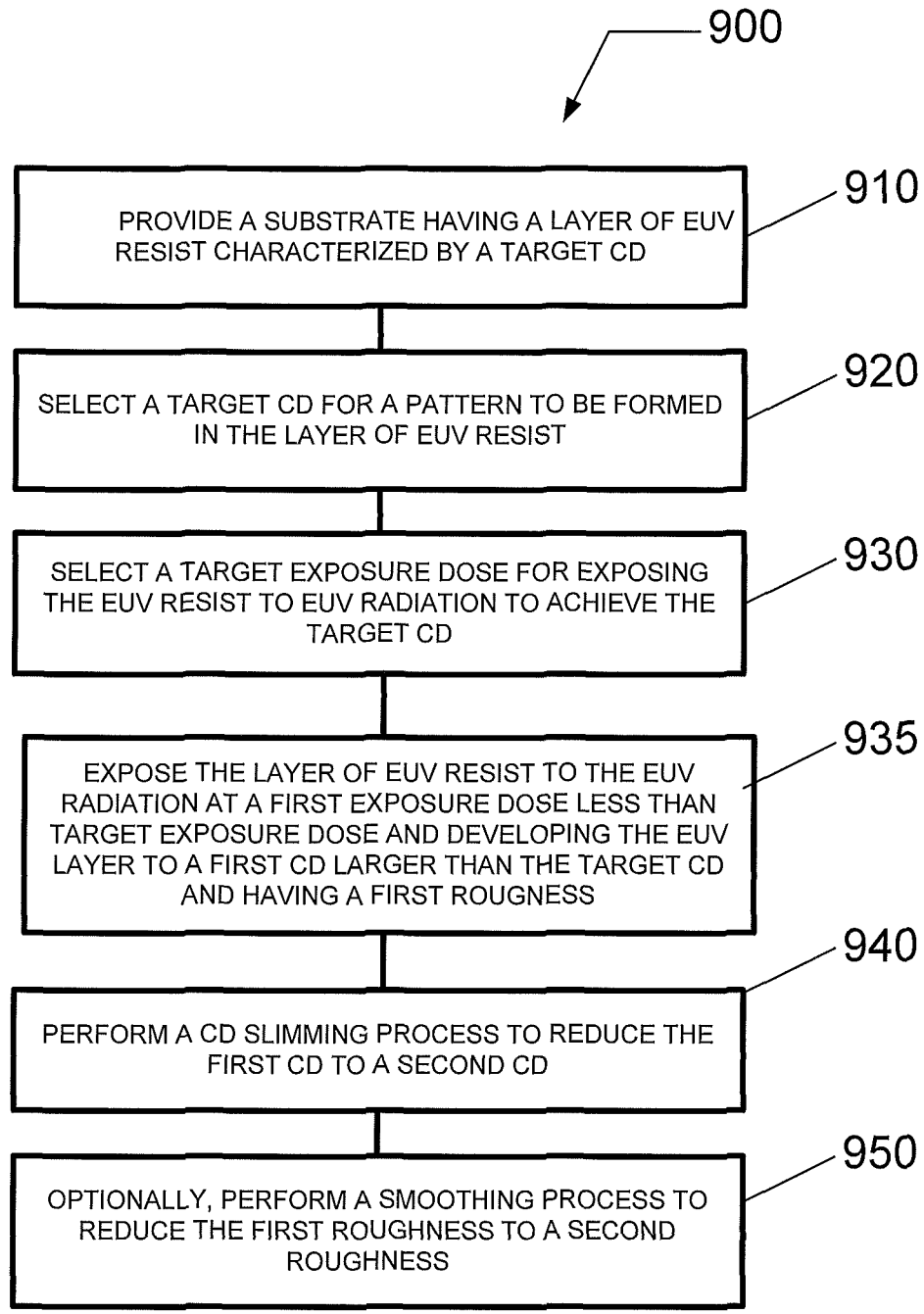
FIG. 9 provides a flow chart illustrating a method of reducing resist sensitivity to generate enabling throughput for EUV lithography according to an embodiment.

FIG. 9 provides a flow chart 900 illustrating a method of reducing resist sensitivity to generate enabling throughput for EUV lithography according to an embodiment. In operation 910, a substrate with a layer of EUV resist is provided where the layer of EUV resist is characterized by a target CD. The process of providing the substrate is similar to the process of forming the layer of radiation-selected material on the substrate described above in relation to operation 210 of FIG. 2. In operation 920, a target CD for a pattern to be formed in the layer of EUV resist is selected. The target CD can be in the range of 40 nm or lower. In operation 930, a target exposure dose for exposing the EUV resist to EUV radiation to achieve the target CD is selected. In operation 935, the layer of EUV resist is exposed to the EUV radiation at a first exposure dose less than the target exposure dose and developing the EUV layer to a first CD larger than the target CD and having a first roughness.

Still referring to FIG. 9, in operation 940, a CD slimming process to reduce the first CD to a second CD is performed on the substrate. As mentioned above, the slimming process can be one or more of the slimming techniques described in relation to FIG. 3. In addition, the smoothing process can comprise a vapor smoothing process, the vapor smoothing process can be performed proceeding, following or during the CD slimming process. The slimming process can further comprise (a) dispensing a developing solution on the substrate, the developing solution heated to a hot develop temperature exceeding 30 degrees C.; (b) treating the substrate with a treatment compound containing an acid; (c) baking the substrate to diffuse the acid into the pattern; and (d) dispensing another developing solution on the substrate. Furthermore, the smoothing process can be performed following the dispensing the developing solution and preceding the treating the substrate. In addition, the smoothing process can be performed following the baking the substrate and preceding the dispensing the another developing solution, where the developing solution comprises a tetramethyl ammonium hydroxide (TMAH) solution. The concentration and temperature of the treatment compound containing the acid and time for treatment of the treatment compound to the substrate, and the temperature and time of exposure of the substrate to the baking to diffuse the acid are adjusted to achieve pattern CD control.

In operation 950, an optional smoothing process to reduce the first roughness to a second roughness is performed. Similarly, as mentioned above, the optional smoothing process can include one or more techniques of smoothing described in relations to FIGS. 4A to 4D. The smoothing process can further comprise: (a) performing one or more additional vapor smoothing processes to further reduce the second roughness to another reduced roughness, (b) exposing the pattern to a treatment vapor, the treatment vapor containing N-Methylpyrrolidone or N-Methyl-2-pyrrolidone, (c) heating the substrate during the exposing of the pattern on the substrate to the treatment vapor, (d) irradiating the substrate with a second electromagnetic (EM) radiation during the exposing of the pattern on the substrate to the treatment vapor, and (e) reflowing the pattern and subjecting the substrate to a drying process.

Reduction of the first exposure dose can be approximately 10%, 20%, 30%, or 40% less than the target exposure dose. The operation of performing the smoothing process to reduce the first roughness to the second roughness can achieve a reduction of roughness exceeding 10%, 30% or 50%. The operation of exposing the layer of EUV resist to the EUV radiation at the first exposure dose less than the target exposure dose reduces the substrate exposure, the reduced substrate exposure allowing an increase in substrate throughput substantially equivalent to 50 or more substrates per hour.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for patterning a substrate, comprising:
   providing a substrate having a layer of extreme ultra violet (EUV) resist characterized by a target critical dimension (CD);
   selecting a target CD for a pattern to be formed in said layer of EUV resist;
   selecting a target exposure dose for exposing said layer of EUV resist to EUV radiation to achieve said target CD in said layer of EUV resist;
   exposing said layer of EUV resist to said EUV radiation at a first exposure dose less than said target exposure dose and developing said layer of EUV resist to achieve said pattern with a first CD larger than said target CD, said pattern having a first roughness;
   performing a CD slimming process to reduce said first CD to a second CD, said second CD being substantially equivalent to said target CD; and
   performing, optionally, a smoothing process to reduce said first roughness to a second roughness.

2. The method of claim 1, wherein said smoothing process comprises a vapor smoothing process.

3. The method of claim 2, wherein said vapor smoothing process is performed proceeding, following, or during said CD slimming process.

4. The method of claim 2, wherein said CD slimming process comprises:
   dispensing a developing solution on said substrate, said developing solution heated to a hot develop temperature in a range from 30 to 50 degrees C.;
   treating said substrate with a treatment compound containing an acid;
   baking said substrate to diffuse said acid into said pattern; and
   dispensing another developing solution on said substrate.

5. The method of claim 4, wherein said smoothing process is performed following said dispensing said developing solution and preceding said treating said substrate.

6. The method of claim 4, wherein said smoothing process is performed following said baking said substrate and preceding said dispensing said another developing solution.

7. The method of claim 4, wherein said developing solution comprises a tetramethyl ammonium hydroxide (TMAH) solution.

8. The method of claim 4, wherein concentration and temperature of said treatment compound containing said acid and time for treatment of said treatment compound to said substrate are adjusted to achieve pattern CD control.

9. The method of claim 4, wherein temperature and time of exposure of said substrate to said baking to diffuse said acid are adjusted to achieve pattern CD control.

10. The method of claim 2, further comprising:
    performing one or more additional vapor smoothing processes to further reduce said second roughness to another reduced roughness.

11. The method of claim 10, wherein said performing said vapor smoothing process comprises:
    exposing said pattern to a treatment vapor, said treatment vapor containing N-Methylpyrrolidone or N-Methyl-2-pyrrolidone.

12. The method of claim 10, wherein said performing said vapor smoothing process further comprises:
    heating said substrate during said exposing of said pattern on said substrate to said treatment vapor.

13. The method of claim 10, wherein said performing said vapor smoothing process further comprises:
    irradiating said substrate with a second electromagnetic (EM) radiation during said exposing of said pattern on said substrate to said treatment vapor.

14. The method of claim 10, further comprising reflowing said pattern and subjecting said substrate to a drying process.

15. The method of claim 1, wherein said first exposure dose is selected to be approximately 10% less than said target exposure dose.

16. The method of claim 1, wherein said first exposure dose is selected to be approximately 20% less than said target exposure dose.

17. The method of claim 1, wherein said first exposure dose is selected to be approximately 30% less than said target exposure dose.

18. The method of claim 1, wherein said first exposure dose is selected to be approximately 40% less than said target exposure dose.

19. The method of claim 1, wherein performing said smoothing process to reduce said first roughness to said second roughness achieves a reduction of roughness exceeding 10%.

* * * * *

UNITED STATES PATENT AND TRADEMARK OFFICE
CERTIFICATE OF CORRECTION

PATENT NO. : 9,086,631 B2
APPLICATION NO. : 13/865138
DATED : July 21, 2015
INVENTOR(S) : Huli et al.

Page 1 of 1

It is certified that error appears in the above-identified patent and that said Letters Patent is hereby corrected as shown below:

In the Specification:

Col. 1, line 50, "that allows the reduction" should read --that allow the reduction--.

Col. 2, line 15, "FIGS. 5A and 5B provides" should read --FIGS. 5A and 5B provide--.

Col. 2, line 17, "FIGS. 5C and 5D provides" should read --FIGS. 5C and 5D provide--.

Col. 8, line 20, "vapor smoothing, includes," should read --vapor smoothing, include,--.

Col. 10, line 32, "be performed proceeding," should read --be performed preceding,--.

In the Claims:

Col. 11, line 42, Claim 3, "is performed proceeding," should read --is performed preceding,--.

Signed and Sealed this
Nineteenth Day of January, 2016

Michelle K. Lee
*Director of the United States Patent and Trademark Office*